United States Patent [19]

Plumb

[11] Patent Number: 4,949,352
[45] Date of Patent: Aug. 14, 1990

[54] LASER MANUFACTURE

[75] Inventor: Richard G. S. Plumb, Ipswich, England

[73] Assignee: ITT Corporation, New York, N.Y.

[21] Appl. No.: 296,946

[22] Filed: Jan. 17, 1989

Related U.S. Application Data

[62] Division of Ser. No. 861,015, May 8, 1986, Pat. No. 4,830,986.

[30] Foreign Application Priority Data

May 15, 1985 [GB] United Kingdom ................ 8512321

[51] Int. Cl.[5] ............................................. H01S 3/19
[52] U.S. Cl. ......................................... 372/46; 372/45; 357/16; 357/17
[58] Field of Search ....................... 372/44, 45, 46, 43; 357/16, 17

[56] References Cited

U.S. PATENT DOCUMENTS 4,121,179 10/1978 Chinone et al. .................... 372/46

OTHER PUBLICATIONS

Kaminow et al., "Performance of An Improved In-GaAsP Ridge Waveguide Laser at 1.3 μm", Electronics Letters, vol. 17, No. 9, Apr. 30, 1981, pp. 318–320.
Tsukada et al., "Very-Low-Current Operation of Mesa-Stripe-Geometry Double-Heterostructure Injection Laser," Appl. Phys. Lett., vol. 20, No. 9, May 1, 1972, pp. 344–345.
Kaminow et al., "Single-Mode CW Ridge-Waveguide Laser Emitting at 1.55 μm", Conference of Integrated and Guided-Wave Optics Technical Digest, Jan. 23–30, 1980, MDS 1–4.

*Primary Examiner*—William L. Sikes
*Assistant Examiner*—Georgia Y. Epps
*Attorney, Agent, or Firm*—Walter J. Baum; Peter A. Abruzzese; Thomas N. Twomey

[57] ABSTRACT

A ridge waveguide laser structure is manufactured by a method including providing a photoresist stripe (8) on an exposed area of a p cap layer (4) of a multilayer laser wafer; etching channels (9) through the cap layer (4) and a p passive layer (3) using the stripe (8) and an oxide layer window (FIG. 4) as a mask; evaporating a passivating and insulating oxide (11, 11a) over the wafer, there being breaks (C) in the oxide where the stripe (8) is undercut during channel etching; and removing the stripe (8) and the oxide (11a) on it by a lift-off technique.

7 Claims, 2 Drawing Sheets

LASER MANUFACTURE

This patent application is a division of U.S. application Ser. No. 861,015, of the same inventor, filed on May 8, 1986, which issued as U.S. Pat. No. 4,830,986 on May 16, 1989.

This invention relates to laser manufacture and in particular to the manufacture of a ridge waveguide laser structure.

BACKGROUND OF THE INVENTION

Various methods of manufacturing ridge waveguide structures have previously been proposed. For example, the Kaminow method which uses standard processing with two-step photolithography, a first step to define double channels in, for example, a standard double heterojunction layer structure between which the ridge is disposed and a second step to open contact windows to the ridge. The ridge is electrically isolated from the remainder of the layer structure by silicon dioxide which is deposited to cover the entire device, and extends into the channels, following ridge definition and in which the contact windows to the ridges have to be subsequently opened. An alternative method involves only a single photolithographic step and a lift-off technique. In this method a standard double heterojunction layer structure is provided with a silicon dioxide layer on the cap layer and successive layers of titanium and gold deposited thereon. Using the single photolithographic step a window is provided in a photoresist layer the gold is etched via this window so that the photoresist is undercut. The titanium and silicon dioxide are then etched, the extent of the gold etching meaning that these layers are also etched a greater extent than exposed by the window. Successive layers of titanium and gold are then deposited over the photoresist during which process ridge contact layers of titanium and gold are built up in the undercut recess via the window and of dimensions determined by the window. The photoresist is then removed, simultaneously lifting off the titanium and gold layers deposited thereon, and the double channels etched using the structure produced so far to provide its own masking (self-aligned) to produce the full ridge structure which is already contacted. This method of manufacture results in the disadvantage that the sides of the doubles channels are not insulated and there is the possibility of short circuits when the devices have connections soldered thereto.

SUMMARY OF THE INVENTION

It is an object of the present invention to provide an alternative method of manufacturing ridge waveguide laser structures which is fully protected as well as self-aligned.

According to one aspect of the present invention there is provided a method of manufacturing a ridge waveguide laser structure including the steps of employing a photoresist stripe on a surface of a multilayer wafer to define the ridge, providing an insulating layer on said surface and on said photoresist stripe on the ridge, and removing the photoresist stripe whilst simultaneously lifting off the insulated layer thereon.

According to a further aspect of the present invention there is provided a ridge waveguide laser structure formed in a multilayer laser wafer and including an insulating layer extending over the processed surface of the wafer but only partway up the sidewalls of the ridge towards the outermost layer of the ridge and not on said outermost layer, and including an electrical contact to said outermost layer.

BRIEF DESCRIPTION OF THE DRAWINGS

Embodiments of the invention will now be described with reference to the accompanying drawings, in which.

DESCRIPTION OF THE PREFERRED EMBODIMENT

The invention is directed to a laser wafer with a layer structure used in ridge waveguide lasers of the type shown, for example, in U.S. Pat. No. 4,400,813 of Kaminow or U.S. Pat. No. 4,213,805 of Tsukada. The overall structure and operation of the ridge waveguide laser is known and is not discussed further herein, and reference may be made to the above-noted patents for a further explanation thereof.

Figure 1:
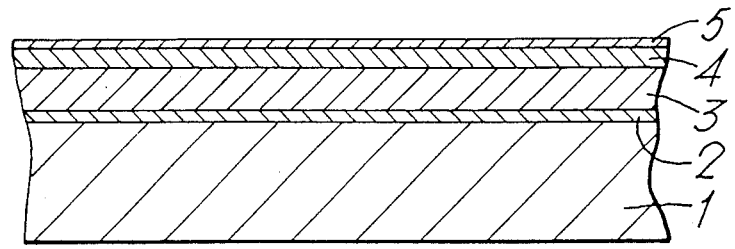
FIGS. 1 to 7 illustrate cross-sections through a device during successive processing stages.

The embodiment of ridge waveguide structure whose manufacture is to be described employs a laser wafer with a layer structure (FIG. 1) comprising an n passive/substrate layer 1, although a conventional double heterojunction structure with a separate n passive layer on an n substrate may alternatively been employed, a p active layer 2, a p passive layer 3, and a p cap layer 4. Typically the layer 1 is of InP, the layer 2 of GaInAsP, the layer 3 is of InP and the layer 4 is of GaInAsP or GaInAs. A silicon dioxide layer 5 is deposited on the cap layer 4.

In addition the active layer 2, may be split into 2 or 3 to include guide layers on either or both sides. The upper guide layer may also function as an "anti-meltback" layer as well as a guide layer.

Figure 2:
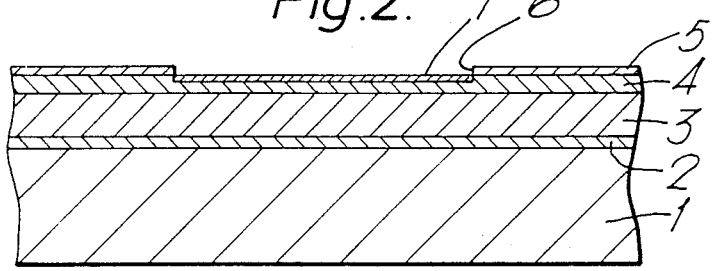

Using standard photolithography with photoresist (not shown) windows 6, (FIG. 2), which are typically 20 $\mu m \pm 5$ $\mu m$ wide and the full length of the wafer are etched in the silicon dioxide 5. At this stage an optional contact diffusion 7 may be performed if required using, for example, zinc or cadmium in a closed or open capsule.

Figure 3:
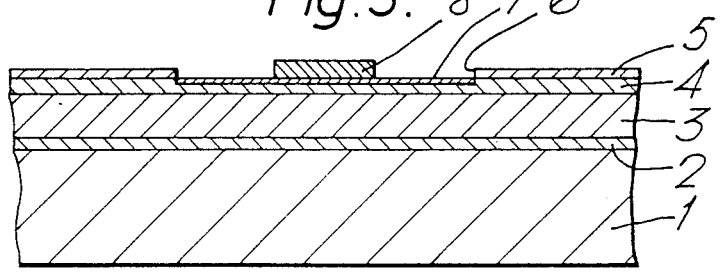

In a second photolithographic step a photoresist stripe 8 (FIG. 3) is defined on the cap layer 4 (which may be diffused 7 as shown) exposed by the window 6. The width of the stripe is determined by the required ridge waveguide width and for example may be 5 $\mu m$, the positioning within the window 6 is not critical.

Figure 4:
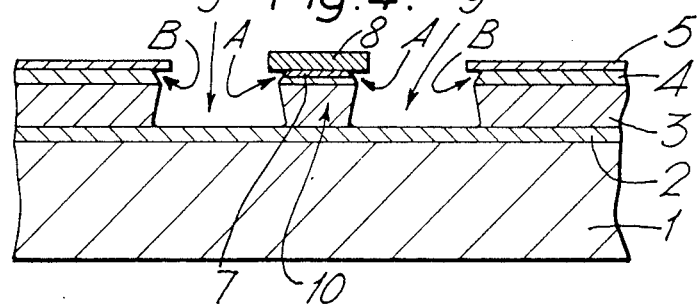

Using the longitudinal edges of the photoresist strip 8 and the window 6 in the oxide 5 as a mask, double channels 9 (FIG. 4) to define the ridge 10 are etched first in the cap layer 4 using a suitable etchant, and then in the p passive InP layer 3 using an InP selective etch whereby etching of the channels stops automatically at the active layer 2, or an antimeltback layer (not shown) optionally provided thereon. Undercutting of the layers under the photoresist stripe 8 and the silicondioxide 5 results as shown at A and B respectively.

Figure 5:
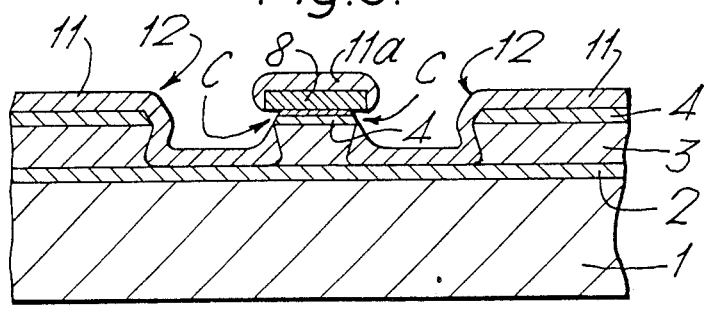

The remaining silicon dioxide is then stripped off and a passivating and insulating oxide 11, 11a (FIG. 5), for example aluminium oxide $Al_2O_3$ or $SiO_2$ or $Si_3N_4$, evaporated over the upper surface of the layer wafer as so far processed. As is apparent from FIG. 5 the oxide 11 is continuous over the channel edges 12 and extends part way up the ridge walls, but owing to the undercutting of the resist stripe 8, the oxide 11 is broken under the edges of the stripe 8, as shown at C.

Figure 6:
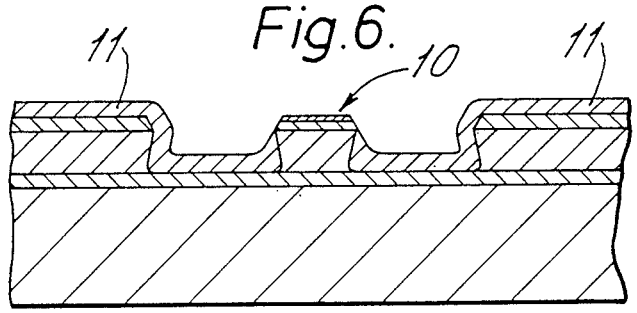
Figure 7:
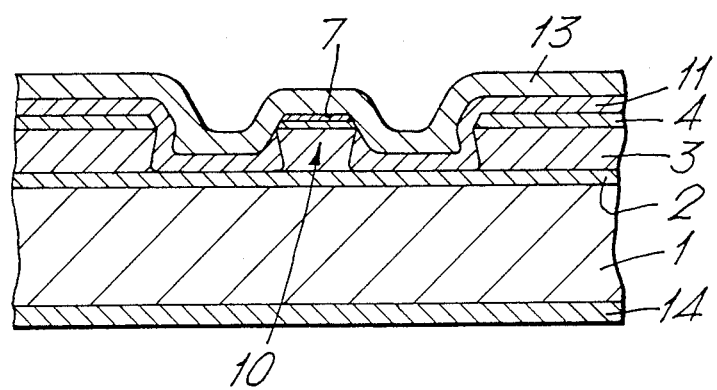

The photoresist stripe 8 is then stripped off using an appropriate solvent and simultaneously lifting off the portion of the oxide 11a on the ridge 10. The structure is then as illustrated in FIG. 6. It only remains to metallize both sides of the laser wafer for electrical contact purposes. The metallization 13 to the p side of the laser wafer may be provided by the application of successive layers of titanium, platinum and gold (in that order) to the passivating layer 11 and the exposed cap layer 4. The metallization 14 to the n side of the laser wafer may be provided an alloyed gold/tin layer to the substrate 1 followed by a gold layer.

The method described above thus employs two step photolithography (to define the window 6 and to define the resist stripe 8) and an evaporated insulator 11 together with a lift-off technique to give a fully protected and self-aligned laser structure, with a good life potential and low threshold voltage, and which is simpler than the conventional methods to implement.

I claim:

1. A laser wafer having a multilayer structure, for use in a ridge waveguide laser, comprising in order:

a substrate layer;

an active layer provided on the substrate layer;

a passive layer provided on the active layer having a pair of channels etched therein down to the active layer on each side of a central ridge layer, each channel being defined by a pair of opposing sidewalls extending upwardly from the active layer, and the central ridge layer having a given width at an upper surface thereof and being defined by an adjoining sidewall of each of the channels which is undercut from the width of the upper surface to a narrower width at the active layer;

a cap layer provided on the passive layer on each side of the pair of channels and on the central ridge layer but not in the channels etched in the passive layer;

an insulating layer provided on the cap layer on each side of the pair of channels, in the channels on the active layers, and along the sidewalls of each channel including the sidewalls adjoining the central ridge layer, wherein the insulating layer terminates on the adjoining sidewalls of the central ridge layer exactly at the undercut upper surface of the central ridge layer due to the undercutting of the adjoining sidewalls thereof, and does not extend onto the upper surface of the central ridge layer; and a metallization layer provided on the insulating layer.

2. A laser wafer having a multilayer structure according to claim 1, wherein the insulating layer is made of a passivating and insulating oxide material.

3. A laser wafer having a multilayer structure according to claim 2, wherein the insulating layer is made of aluminum oxide or silicon dioxide.

4. A laser wafer having a multilayer structure according to claim 1, wherein the insulating layer is made of a refractory insulator material.

5. A laser wafer having a multilayer structure according to claim 4, wherein the insulating layer is made of silicon nitride.

6. A laser wafer having a multilayer structure according to claim 1, wherein the substrate layer is made of n-type material, the active layer is made of p-type material, the passive layer is made of p-type material, and the cap layer is made of p-type material.

7. A laser wafer having a multilayer structure according to claim 6, wherein a contact diffusion layer is provided on the cap layer on the central ridge layer, and the metallization layer is a continuous outermost layer.

* * * * *